(12) United States Patent
Huang et al.

(10) Patent No.: US 6,843,879 B1
(45) Date of Patent: Jan. 18, 2005

(54) SEPARATION METHOD FOR OBJECT AND GLUE MEMBRANE

(75) Inventors: Story Huang, Hsinchu (TW); Jia-Bin Hsu, YunLin (TW); Chun-Hsien Liu, Taipei (TW); Chia-Hung Hung, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 10/867,659

(22) Filed: Jun. 16, 2004

Related U.S. Application Data

(62) Division of application No. 10/321,491, filed on Dec. 18, 2002.

(51) Int. Cl.[7] .............................................. B32B 35/00

(52) U.S. Cl. ...................... 156/344; 156/584; 438/464; 438/976

(58) Field of Search ............................. 156/344, 584; 438/464, 976

(56) References Cited

U.S. PATENT DOCUMENTS 6,561,743 B1 * 5/2003 Nakatsu ...................... 414/403
2003/0077880 A1 * 4/2003 Shinjo et al. ............... 438/462

FOREIGN PATENT DOCUMENTS

JP 3-58445 * 3/1991 ................. 156/344

* cited by examiner

Primary Examiner—Mark A. Osele
(74) Attorney, Agent, or Firm—Troxell Law Office PLLC

(57) ABSTRACT

The invention provides a separation method for object and glue membrane, and it is characterized: an external force such as tearing apart is pre-applied for appropriately separating the glue membrane and the object, such that the binding ability between the object and the glue membrane is reduced, and a taking-and-placing head then sucks up the object; to achieve said objective, it can arrange a vacuum sucking-up seat that is moveable and has vacuum adsorption hole under the glue membrane, and the sucking force of the vacuum sucking-up seat may generate an external force such as tearing apart to the glue membrane, and the object is then sucked up by the taking-and-placing head; it is also possible to arrange a connection rod to lower down and lift up the taking-and-placing head simultaneously and, before the taking-and-placing head is lowered down to contact the object, it may bring along the connection rod to press down the glue membrane and generate an external force such as tearing apart to the glue membrane, and the object is then sucked up by the taking-and-placing head; since the external force is not applied upon the object, so it may control the deforming rate of the objet to a minimum degree, such that the object may be avoided from being broken and be not caused to move, and it may also peel apart multiple chips, such that the production speed is increased and the taking-up time is shortened.

4 Claims, 7 Drawing Sheets

FG. 7B

SEPARATION METHOD FOR OBJECT AND GLUE MEMBRANE

This application is a Division of currently pending application U.S. Ser. No. 10/321,491, entitled "SEPARATION METHOD FOR OBJECT AND GLUE MEMBRANE" and filed on Dec. 18, 2002.

FIELD OF THE INVENTION

The invention provides a separation method for object and glue membrane, and it is characterized: an external force such as tearing apart is pre-applied for appropriately separating the glue membrane and the object, such that the binding ability between the object and the glue membrane is reduced, and a taking-and-placing head then sucks up the object; since the external force is not applied upon the object, so it may control the deforming rate of the objet to a minimum degree, such that the object may be avoided from being broken and be not caused to move, and it may also peel apart multiple chips, such that the production speed is increased and the taking-up time is shortened.

BACKGROUND OF THE INVENTION

In traditional manufacturing process for object, there is one step that has to separate the object from the glue membrane that is adhered to the object, and the object is then picked up for proceeding the subsequent steps of manufacturing process; for example, when the manufacturing process for the adhesive chip of the semiconductor is under proceeding, the chip must be taken out piece by piece from the glue membrane first, and the chip is then turned over and welded onto the substrate; please refer to FIG. 1A to FIG. 1D, which illustrate the method for taking up the chip:

a. As shown in FIG. 1A, wherein a taking-and-placing head 10 having vacuum sucking ability is arranged within a seat body 11, and an elastic element 12 is arranged above the taking-and-placing head 10, correspondingly under which a thimble 20 is arranged, and the chip 30 is adhered on the glue membrane 40 that is solidified by ultraviolet ray, and the glue membrane 40 adhered with chip 30 is sent to the space between the taking-and-placing head 10 and the thimble 20 by a conveying apparatus (not shown in the figure) for processing chip-taking process;

b. As shown in FIG. 1B, when the chip 30 is positioned, the taking-and-placing head 10 is lowered down to the surface of the chip 30 and is adhered thereon;

c. As shown in FIG. 1C, after the taking-and-placing head 10 has indeed adhered the chip 30, the thimble 20 is abutted against the chip 30 upwardly to make the chip 30 risen an appropriate distance and compress the elastic element 12 arranged above the taking-and-placing head 10 at the same time, such that the glue membrane 40, around the contacting point 21, between the thimble 20 and the chip 30, is separated from the chip 30 because of the pulling force acting on its surrounding;

d. As shown in FIG. 1D, when the chip 30 and the glue membrane have been separated from each other, the taking-and-placing head 10 is lifted to suck the chip 30 away from the membrane 40.

The main drawback of said separation method for chip and glue membrane by thimble is: for a chip with 5 mm dimension, it must use a thimble with an abutting force of 400 gram to overcome the restraint of the binding force of the glue membrane so, when the chip is thinned to a limitation, the tension subjected by the chip is increased relatively, such that the deformation rate of the chip is enlarged, even a broken situation may be occurred, so it is known that there is an extreme limitation for this abutting-and-taking method with a thimble, particularly for thin chip.

Please again refer to FIG. 2A to FIG. 2C, which illustrate the U.S. Pat. No. 4,990,051—"Pre-peel Die Ejector Apparatus", which discloses a method and its apparatus for taking down an object from the glue membrane; as shown in the figure, the invention has a vacuum plate device 1, within which a thimble 2 is arranged, and a tubular structure 3 is fitted externally to the thimble 2, and a taking-and-placing head 4 having vacuum sucking ability is correspondingly arranged under the thimble 2 and the tubular structure 3, and the object 5 is adhered under the adhesive glue membrane 6, which is further arranged at the bottom surface of an elastic membrane 7, wherein the object 5 may be the object such as the chip of semiconductor, and the steps for taking up the object 5 are as the follows:

a. As shown in FIG. 2A, the object 5 is conveyed to the top of the taking-and-placing head 4 under the vacuum plate device 1, by which the object 5 is adhered to the upper surface of the elastic membrane 7;

b. As shown in FIG. 2B, after the object 5 being positioned, the tubular structure 3 is lowered down to an appropriate distance to abut against the elastic membrane 6, the adhesive glue layer 6, and the object 5, etc. simultaneously, such that the object 5 is contacted with the taking-and-placing head 4, so the adhesive glue layer 6 and the object 5 may be separated for the first level, and there is a separation part 8 between the adhesive glue layer 6 and the object 5;

c. As shown in FIG. 2C, after the separation of the first level for the adhesive glue layer 6 and the object 5, the vacuum plate device 1 is lifted up and the thimble 2 is lowered down and projected out the tubular structure 3 simultaneously and, by the counteraction between the vacuum plate device 1 and the thimble 2, the adhesive glue layer 6 and the object 5 are separated for second level; at this time, the adhesive glue layer 6 and the object 5 are only contacted at the thimble 2, and the taking-and-placing head 4 is then controlled to lower down to make the object 5 completely separated from the adhesive glue layer 6.

The improvement point of the said U.S. patent is: for the traditional method to make object separated from the glue membrane by a thimble, since the diameter of the thimble is smaller than that of both object and taking-and-placing head, so it is very easy to cause the object slanted and impossibly picked-up by the taking-and-placing head accurately; furthermore, the invention applies the tubular structure having larger area to be first pressed down the object 5 to the taking-and-placing head 4 to be able to apply force uniformly on the object 5 for avoiding the object from slanting; however, the method, of picking up object, adopted by this invention, is same as the abutting method, by a thimble, illustrated in FIG. 1A, and the only difference is that, in the U.S. patent, there are two levels for the tubular structure 3 and the thimble 2 to separate the adhesive glue layer and, although the tubular structure 3 shares the constraint, of the adhesive glue layer 6, having to be overcome by the thimble 2, it makes the entire structure extremely complicated, and the tubular structure 3 and the thimble 2 cause double impacts to the object 5 so, when the object is thinned over a limitation, the tension subjected correspondingly by the object will be also increased, such that the deformation rate of the object is enlarged, even a broken situation is incurred.

Please refer to FIG. 3A to FIG. 3C, which illustrate another prior art entitled "Picking-Up Method for Thin Chip and Picking-Up Apparatus for Thin Chip" (i.e., ROC Patent No. 469562), which discloses a method including following steps:

(a) Arranging a machine 8', which has a surface contacting with the lower surface of the adhesive piece 1';
the thin chip 3' is adhered on the upper surface of the adhesive piece 1';
the machine 8' has plural sucking holes 7a', 7b' to pull down the adhesive piece 1;
the sucking holes 7a', 7b' respectively have a sucking side to contact the adhesive piece 1';
the adhesive piece 1' is located on the surface of the machine 8';
the machine 8' can move on a horizontal surface correspondingly to a specific referential position (i.e., it can be displaced and rotated);
(b) Arranging a tube clip 4', which may hold the thin chip 3' through a sucking force;
the tube clip 4' has a sucking side to contact the thin chip 3';
the tube clip 4' may hold the thin chip 3' at the sucking side by the sucking force;
(c) Placing the adhesive piece 1' upon the surface of the machine 8', such that the thin chip 3' on the adhesive piece 1' is located at the referential position;
(d) The thin chip 3' is held at the sucking side of the tube clip 4' by the sucking force;
(e) The adhesive piece 1' is held at the sucking sides of the sucking holes 7a', 7b' of the machine 8';
(f) The machine 8' is moved on the horizontal surface correspondingly to the referential position to thereby take down the thin chip 3' from the adhesive piece 1'; and
(g) Picking up by the tube clip 4', the thin chip 3' is taken down from the adhesive piece 1.

In brief, the prior art is first to adhere the tube clip 4' onto the thin chip 3', and the adhesive piece 1' is then pulled down by the sucking holes 7a', 7b', and the tube clip 4' again sucks the thin chip 3' away from the adhesive piece 1'; although this method can avoid the drawbacks possessed by the traditional methods, it still has following shortcomings:

1. The thin chip 3' will be displaced: the thin chip 3' is adhered to the adhesive piece 1' but, when the machine 8' is moved to left direction, the thin chip 3' is still adhered upon the adhesive piece 1', because friction force is existent to indirectly bring along the adhesive piece 1' to make slightly move, even the adhesive piece 1' being deformed, such that the thin chip 3' is slightly slanted, and the tube clip 4' is unable to position the thin chip 3' only by the vacuum sucking force, so the accuracy for taking and placing the thin chip 3' is lowered down, and it influences extremely on the accuracy of semiconductor apparatus that requires micro-meter as unit;
2. The thin chip 3' is damaged: the surface of the thin chip 3' is usually arranged with specific structures, such as: bump or air bridge, etc., so it must avoid these specific structures when the tube clip 4' sucks away the thin chip 3'; however, the said micro displacement of the thin chip 3' will cause the tube clip 4' to contact the specific structure, and it is harmful to the future development of the thin chip with high density;
3. The sucking force will cause the adhesive piece 1' to deform: since the adhesive piece 1' is adhered on the surfaces of the sucking holes 7a', 7b' of the machine 8', so the sucking holes 7a', 7b' must provide stronger sucking force than the surface tension of the adhesive piece 1', otherwise it is impossible to pull down the adhesive piece 1, but this strong sucking force will cause the adhesive piece 1' to deform, and the adhesive piece 1' located at the right side of the machine 8' will be pulled to elongate, and the adhesive piece 1' located at the left side of the machine 8' will be pressed to shorten such that, not only will the thin chip 3' adhered by the tube clip 4' be displaced, but also will the circumferential thin chip that is not adhered by the tube clip 4' be also displaced possibly, such that the accuracy for taking and placing the thin chip is lowered down;
4. The time is consumed too much: since only one thin chip 3' is sucked up at one time, so it is necessary to take time for sucking up and moving the tube clip 4' left and right during the picking up process, such that the picking up and the manufacturing speeds for the thin chip are lowered down;
5. It is unsuitable for a thin chip with smaller dimension: since the sucking holes 7a', 7b' must be changed according to the different sizes of the thin chip 3' so, when the size of the thin chip 3' is smaller than 0.5×0.5 mm, it is impossible to generate enough vacuum sucking force to make the thin chip 3' separated from the adhesive piece 1' because of the smallness of the sucking holes 7a', 7b', but the dimension of the most current semiconductor of III V group is all smaller than 5 mm×5 mm, so it is apparent that the current structure is insufficient.

SUMMARY OF THE INVENTION

According to the drawbacks of the prior arts, the main objective of the invention is to provide a separation method for object and glue membrane, and it is characterized: an external force such as tearing apart is pre-applied for appropriately separating the glue membrane and the object, such that the binding ability between the object and the glue membrane is reduced, and a taking-and-placing head then sucks up the object, so it may reduce the external force subjected by the object to control the deformation rate of the object to a minimum degree, and the object can avoid from damaging, and the picking-up time may be shortened, and the object will be out of displacement.

The secondary objective of the invention is to provide a separation method for object and glue membrane that may directly peel off multiple chips at one time to increase the manufacturing speed.

Another objective of the invention is to provide a separation method for object and glue membrane, wherein the actions for picking-up the chip and tearing away the membrane may be proceeded simultaneously, such that it may increase the manufacturing speed.

Further objective of the invention is to provide a separation method, for object and glue membrane, being able to manufacture a multiheaded taking-and-placing head, and a cycle that may suck up multiple chips to fixing point, such that the manufacturing speed is increased.

Another further objective of the invention is to provide a separation method, for object and glue membrane, being able to avoid the glue strip from being brought along to make small movement by the existence of friction force, even to avoid the glue strip from deforming and making the chip slanted slightly, such that the taking-and-placing accuracy may be enhanced.

The further objective of the invention is to provide a separation method, for object and glue membrane, being able to avoid the taking-and-placing head from small movement without contacting specific structures on the front face of the chip.

For your esteemed members of reviewing committee to further understand and recognize the structural objective and function of the invention, a detailed description incorporated with drawings is presented as the follows.

BRIEF DESCRIPTION OF THE DRAWINGS

FIG. 7A to FIG. 7C are the action illustrations for one preferable embodiment of the method according to the invention to tear object away from glue membrane.

DETAILED DESCRIPTION OF THE INVENTION

Figure 1A:
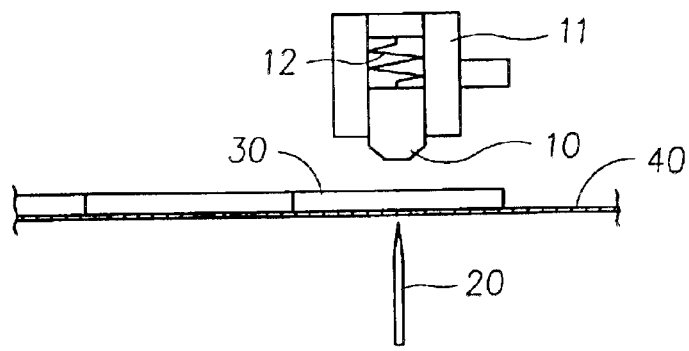
FIG. 1A to FIG. 1D are the action illustrations for a method, of prior art, using a thimble to abut the object and the glue membrane to separate them from each other.
Figure 1B:
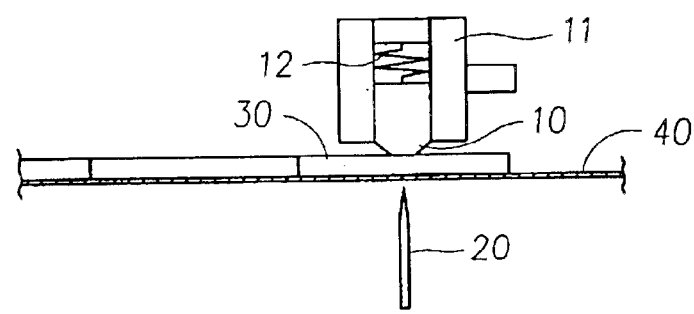
Figure 1C:
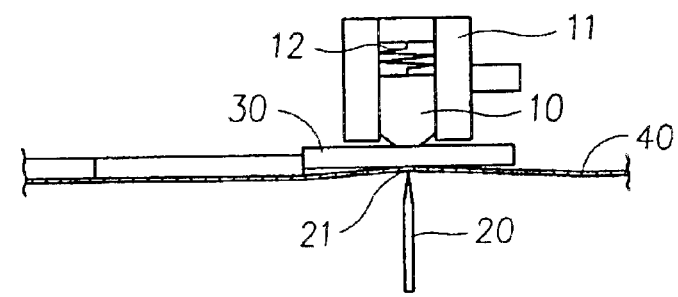
Figure 1D:
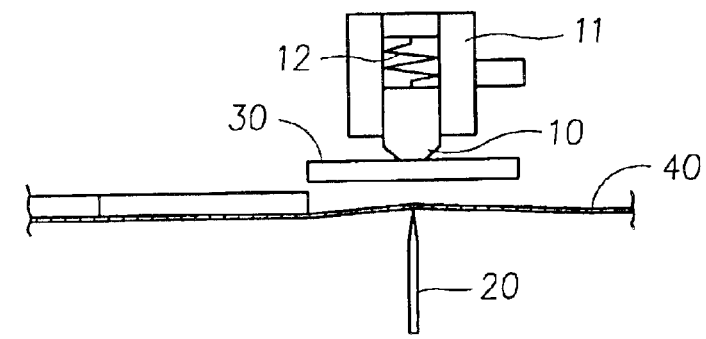
Figure 2A:
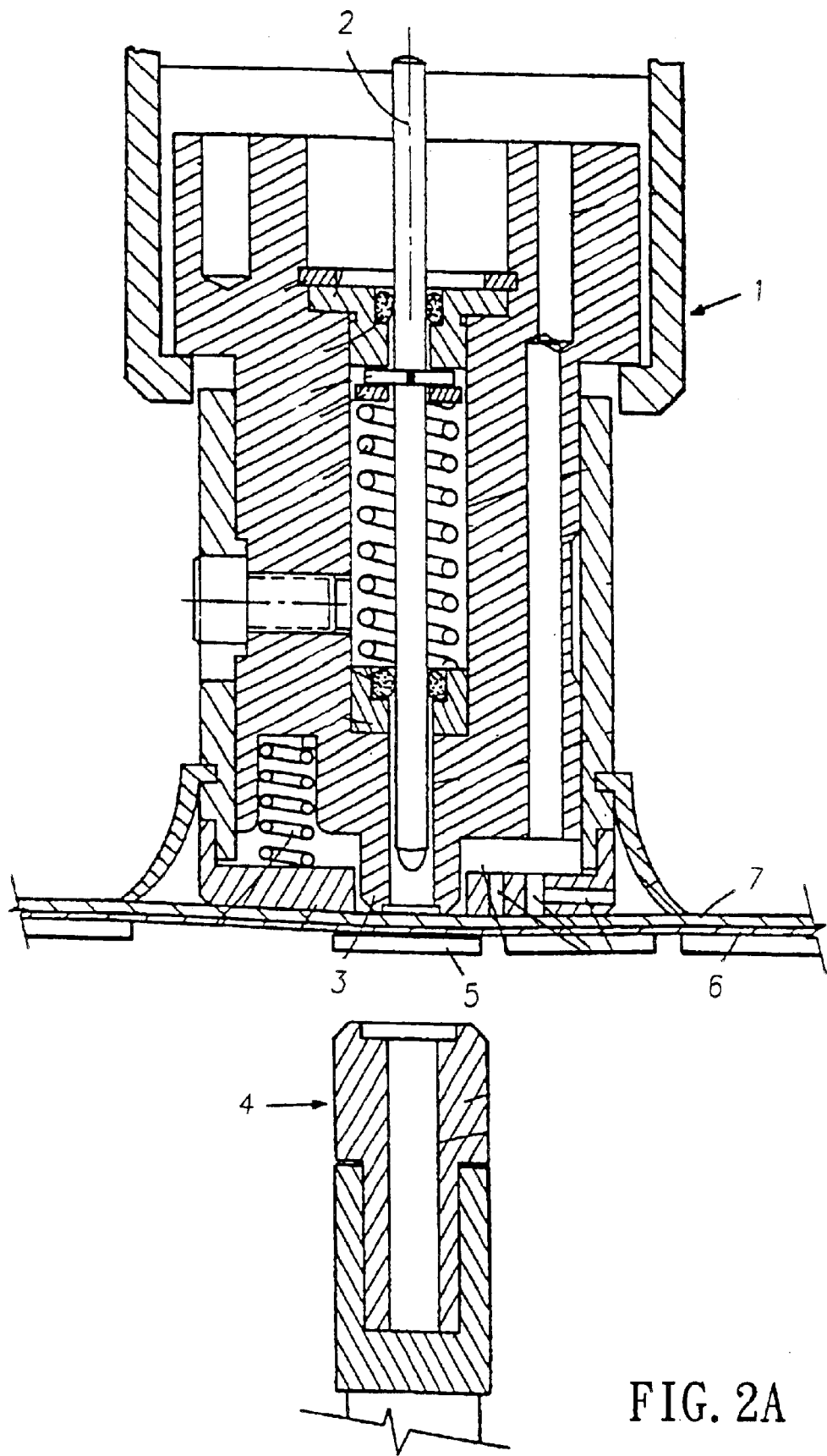
FIG. 2A to FIG. 2C are the action illustrations for another method, of prior art, using a thimble to abut the object and the glue membrane to separate them from each other.
Figure 2B:
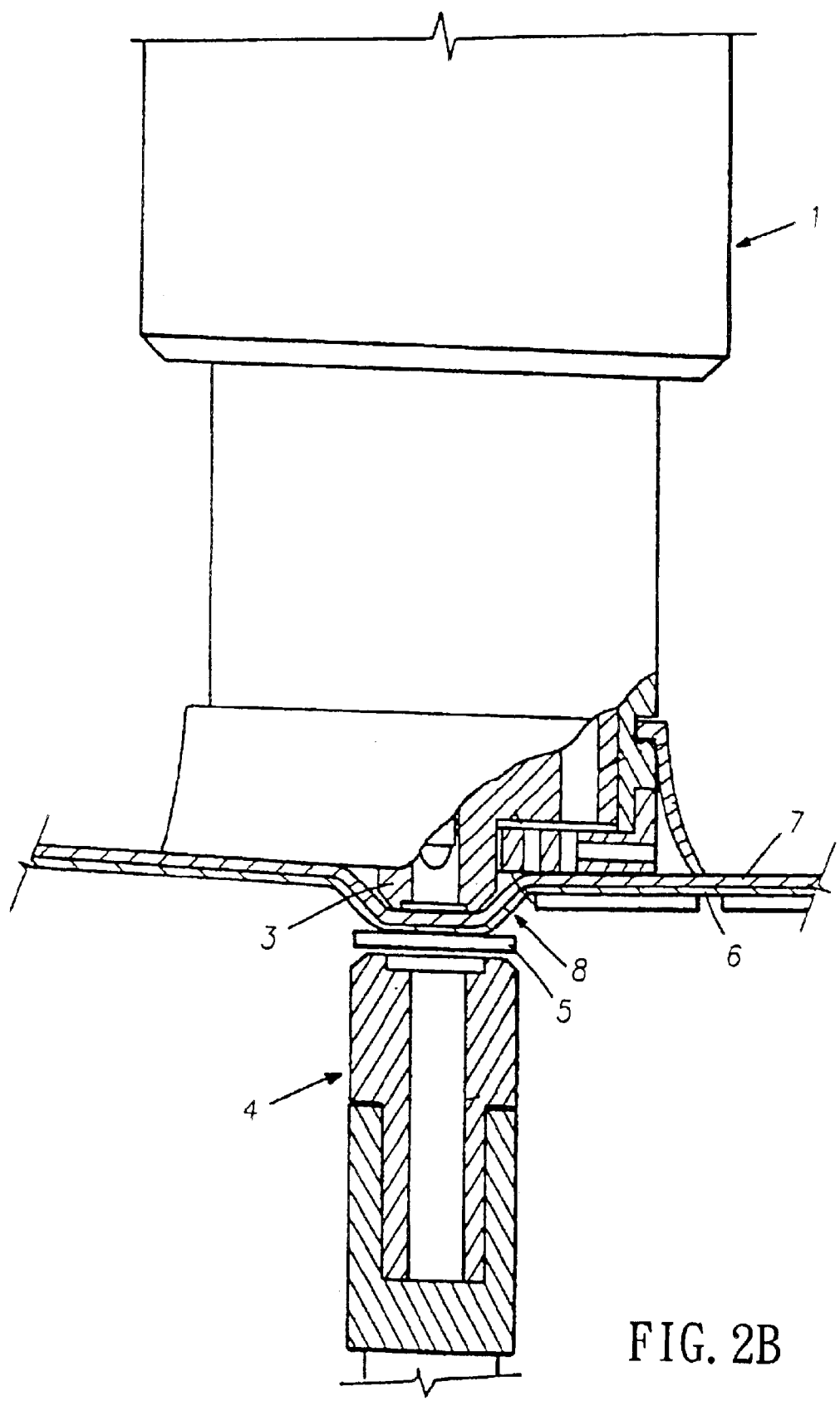
Figure 2C:
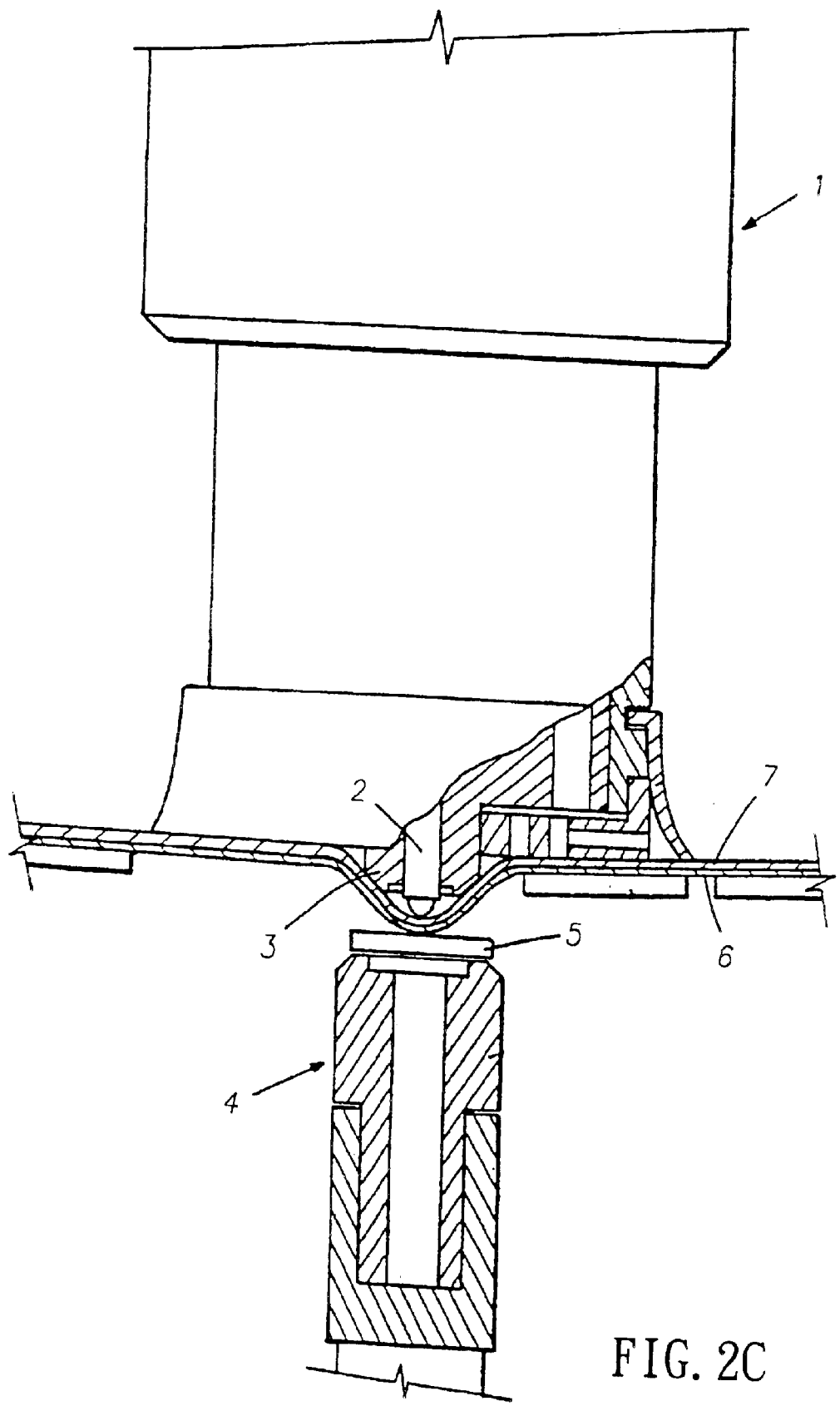
Figure 3A:
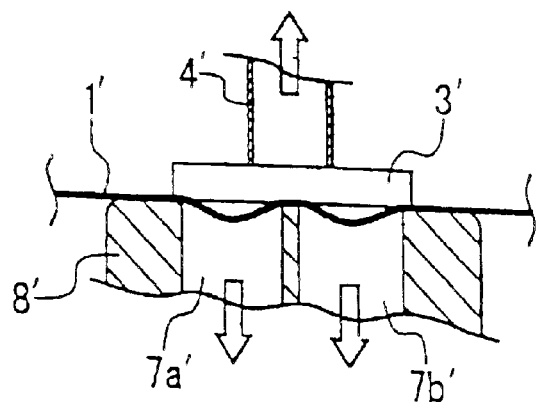
FIG. 3A to FIG. 3C are the action illustrations for the "Picking-Up Method for Thin Chip and Picking-Up Apparatus for Thin Chip" of the prior art.
Figure 3B:
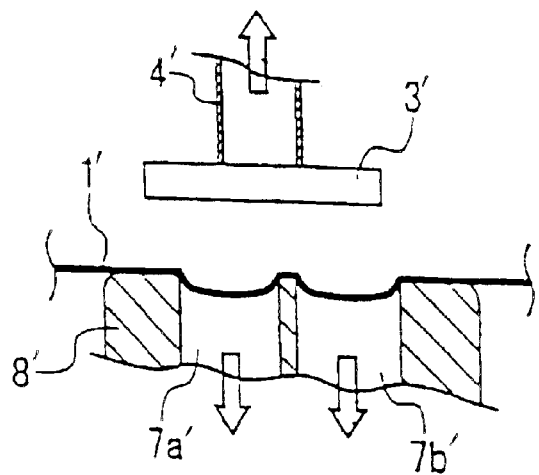
Figure 3C:
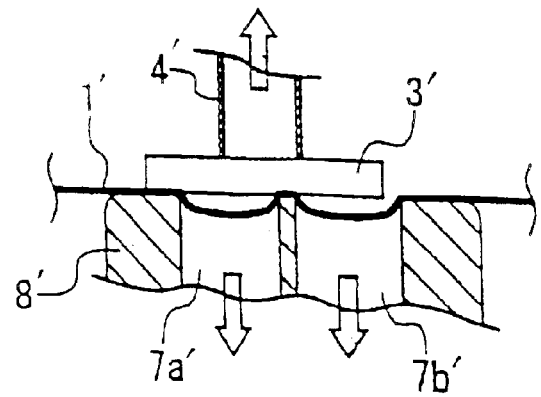

The other objective and detailed structure of the invention will be further accurately understood from the following detailed description; of course, the invention allows some differences in some elements or the arrangement thereof but, in this patent application, the selected embodiments will be described in detail and their structures will be illustrated in the attached drawings too, such that the technical contents of the invention will be further clearly disclosed, and the structures, of the selected embodiments of the invention, shown in the drawings, are only applied for description herein, and are not applied as restrictions for this patent application.

Figure 4A:
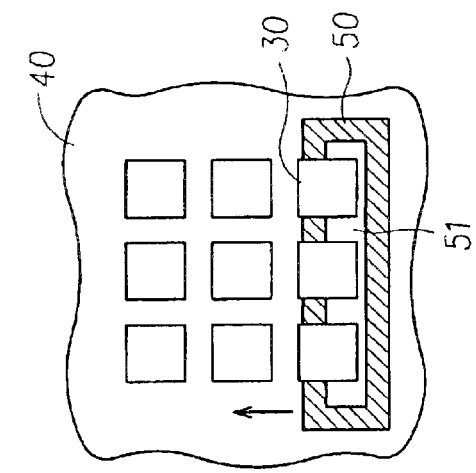
FIG. 4A to FIG. 4C are the action illustrations for a preferable embodiment of the method according to the invention to tear object away from glue membrane.
Figure 4B:
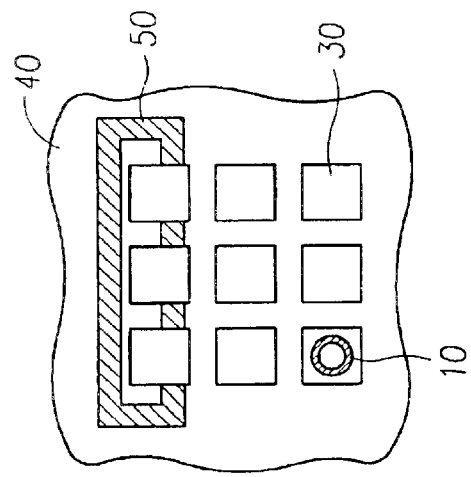
Figure 4C:
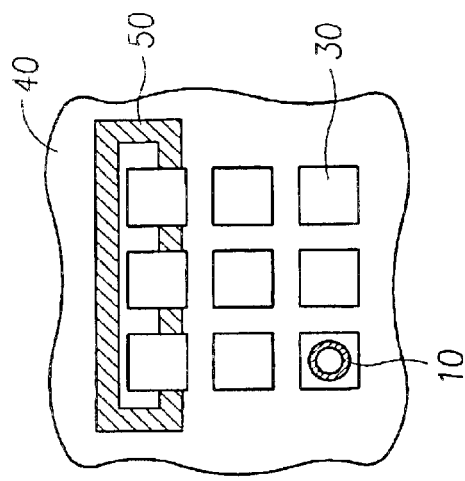
Figure 5A:
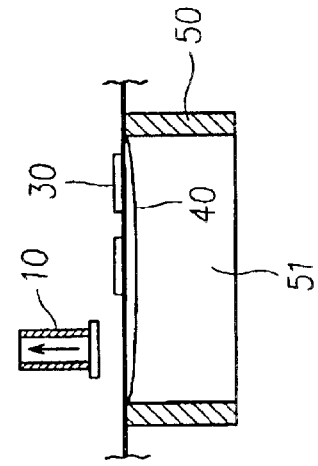
FIG. 5A to FIG. 5C are the side views of the embodiment corresponding to FIG. 4A to FIG. 4C.
Figure 5B:
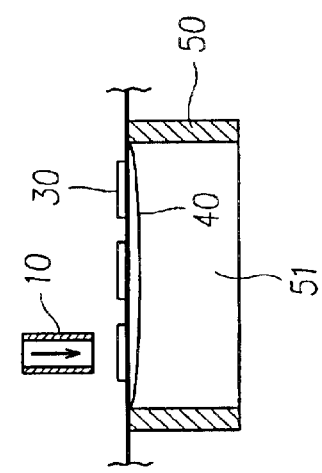
Figure 5C:
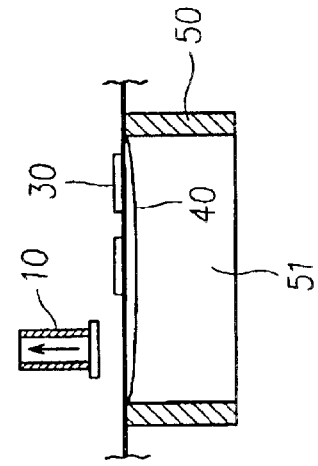

Please refer to FIG. 4A to FIG. 4C, and in the mean time correspond to FIG. 5A to FIG. 5C, wherein an embodied arrangement of the preferable embodiment of the invention is disclosed and, taking the pick-up of chip as a description example, the chip 30 is adhered upon the glue membrane 40 that is solidified by ultraviolet ray, the chip 30 adhered with glue membrane 40 is arranged on a machine (not shown in the figure) fixed motionless, and there is a movable taking-and-placing head 10 arranged above the machine, and a movable vacuum sucking seat 50 is arranged under the glue membrane 40, and the vacuum sucking seat 50 has a vacuum adsorption hole 51 capable of generating a sucking down force, and the size of the vacuum adsorption hole 51 may cover at least one chip 30.

Summarizing above description, the steps of this embodiment for tearing away the glue membrane are as the follows:

a. Arranging a motionlessly fixed machine to support a chip 30, under which a glue membrane is adhered, and a moveable taking-and-placing head 10 is arranged above the machine;

b. Arranging a vacuum sucking seat 50, which has vacuum adsorption hole 51 and may displace with respect to the position of the chip 30;

c. Moving the vacuum sucking seat 50 under the chip 30 and, through the sucking force generated by the vacuum adsorption hole 51 of the vacuum sucking seat 50, an external force for tearing away the glue membrane 40 is generated, such that the chip 30 is separated from the glue membrane 40 for lowering down the binding ability between the chip 30 and the glue membrane 40;

d. The taking-and-placing head 10 is moved over the chip 30, positioned, lowered down, contacted with the chip 30, and adhered onto the surface of the chip 30; and e. After the taking-and-placing head 10 is indeed adhered to the chip 30, the taking-and-placing head 10 is lifted up to suck up the chip 30.

In this embodiment, the vacuum sucking seat 50 is acted repetitiously to appropriately separate the plural chips 30 from the glue membrane 40, and the sucking force, of the vacuum sucking seat, operated on the glue membrane 40 is able to lower down the binding ability between the chip 30 and the glue membrane 40, while the chip 30 and the glue membrane 40 have not been separated from each other completely yet and, under the situation—the chip 30 being adhered to the glue membrane and having a 5 mm×5 mm dimension, since the glue membrane 40 possesses a specific surface tension so, when the sucking force, of the vacuum adsorption hole 51, sucking down the glue membrane 40, is disappeared, the glue membrane 40 is sprung upwardly and is resumed to its original position, the binding force between the glue membrane 40 and the chip 30 is destroyed mostly, but the original adhesion of the glue membrane 40 has not disappeared yet so, by the remaining binding force, the chip 30 is still sufficiently positioned upon the glue membrane 40, and the figures describing the activation of the vacuum adsorption hole 51 are to emphasize the separation state between the glue membrane 40 and the chip 30; therefore, the pursuing point of the invention is: the vacuum adsorption hole 51 firstly acts upon the glue membrane 40 to make the plural chips 30 appropriately separated from the glue membrane 40, then the chips 30 being sucked up one by one by the taking-and-placing head 10, and a visual position may be applied to ensure the position of the chip 30 picked up by the taking-and-placing head 10 and, in such way, the picking up time may be reduced greatly, and there is no other operation of external force during the sucking up process of the chip 30 acted by the taking-and-placing head 10, such that the chip 30 is no longer moved and the picking-and-placing accuracy may be ensured; another point worth noticing is that, during the procedure for the taking-and-placing head to take and place the chip 30, the vacuum adsorption hole 51 is still continuously acting on the glue membrane 40; in other words, the actions for picking up the chip 30 and tearing away the glue membrane are proceeded simultaneously, so it may enhance the production efficiency.

Figure 6:
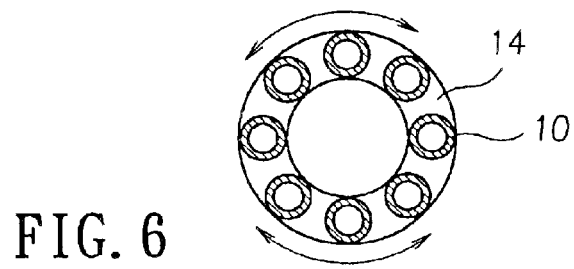
FIG. 6 is the illustration for another preferable embodiment, of the taking-and-placing head, according to the invention.

Please refer to FIG. 6, wherein the plural taking-and-placing heads 10 may be placed upon a rotation plate 14 capable of rotating in cycles, and multiple chips may be sucked up and taken to fixing point during one cycle, so the manufacturing speed is increased.

Figure 7A:
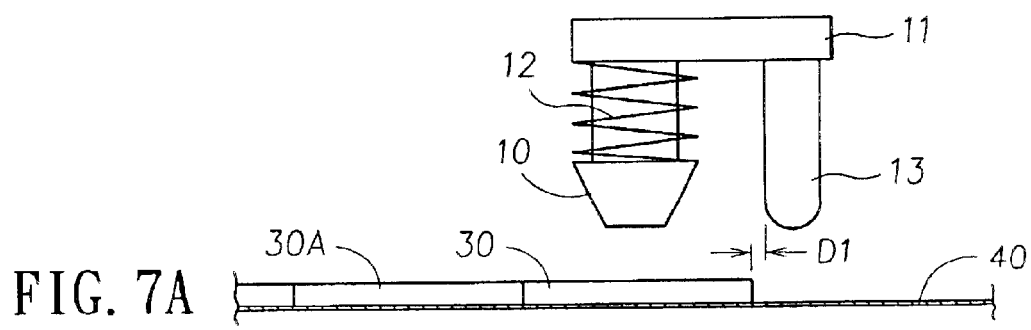
Figure 7C:
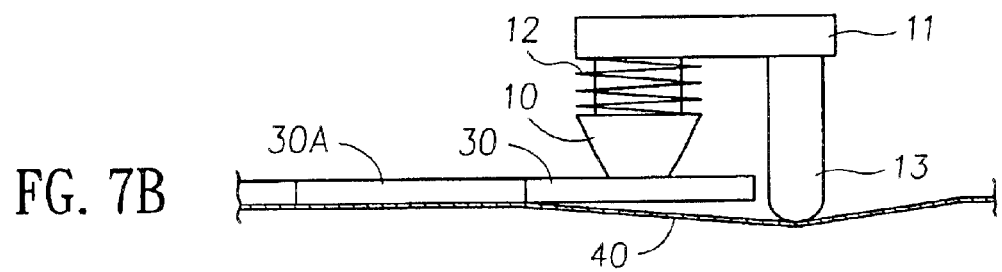

Please again refer to FIG. 7A to FIG. 7C, which disclose the embodying arrangement of another preferable embodiment according to the invention wherein, to pick-up chip is still described as example: the chip 30 is firstly adhered onto the glue membrane 40 that is solidified by ultraviolet ray, and the glue membrane 40 adhered with chip 30 is arranged on a motionlessly fixed machine (not shown in the figure), above which a moveable taking-and-placing head 10 is arranged, and the taking-and-placing head 10 is arranged at the bottom of a seat body 11 also, while there is an elastic element 12 arranged between the top of the taking-and-placing head 10 and the seat body 11, which has a connection rod 13.

Summarizing said description, the steps for this embodiment for tearing away the glue membrane are described as the follows:

a. Arranging a machine used for supporting the chip 30, under which a glue membrane 40 is adhered, and a moveable taking-and-placing head 10 is arranged above the machine;

b. Arranging a connection rod 13 beside the taking-and-placing head 10, and the connection rod 13 may be lifted up and lowered down simultaneously with the taking-and-placing head 10;

c. The taking-and-placing head 10 is moved to the top of the chip 30 and is positioned therein and, before the taking-and-placing head 10 being lowered down to contact with and adhere to the surface of the chip 30, the connection rod 13 may be brought along firstly to be pressed down upon the surface of the glue membrane 40 to generate a tearing apart force to separate the chip 30 from the glue membrane 40; and d. After the taking-and-placing head 10 being indeed adhered to the chip 30, the taking-and-placing head 10 is lifted to suck the chip 30 up and, in the meantime, the connection rod 13 releases the glue membrane 40 off.

This embodiment is to drive the connection rod 13 to press down the glue membrane 40 to be appropriately separated from the chip 30, wherein the connection rod 13 is arranged beside the taking-and-placing head 10 and is kept an appropriate distance D1 with the chip 30, and the distance D1 may be provided for the connection rod 13 to be able to suppress the glue membrane 40 without touching the chip 30 when the connection rod 13 being acted downwardly, and the length of the connection rod 13 is approximately longer than that of the taking-and-placing head 10, such that the taking-and-placing head 10 is lowered down and, before contacting with the chip 30, the connection rod 13 has already contacted with the glue membrane 40 to press down the glue membrane 40 and, under the pressure operated upon the glue membrane 40 by the connection rod 13, it is able to reduce the binding rate between the chip 30 and the glue membrane 40, while the chip 30 and the glue membrane 40 have not completely separated from each other yet so, in order to describe the action of the connection rod 13, the drawings intentionally emphasize the separation state between the glue membrane 40 and the chip 30 and, under the situation that the chip 30 is adhered to the glue membrane 40 with 5 mm×5 mm dimension, since the glue membrane 40 maintains a specific surface tension, so it is appropriate if the pressing force applied to the glue membrane 40 by the connection rod 13 is sufficient enough to destroy the binding force between the glue membrane 40 and the chip 30 and, through the remaining binding force of the glue membrane 40, it is able to make the chip 30 still positioned on the glue membrane 40, so the pursuing emphasis of the invention is: the connection rod 13 firstly presses down the glue membrane 40 to make the plural chips 30 appropriately separated from the glue membrane 40, and the chip 30 is then sucked up by the taking-and-placing head 10 and, if plural taking-and-placing heads 10 are connected to the connection rods 13 in parallel, then the plural chips may be picked up simultaneously, so it may greatly reduce the picking-up time, and there is no any other external force operation during the procedure for the taking-and-placing head 10 to suck up the chip 30, so the chip 30 will not be caused to displace, and the accuracy of the following accuracy may be ensured.

Figure 7C:
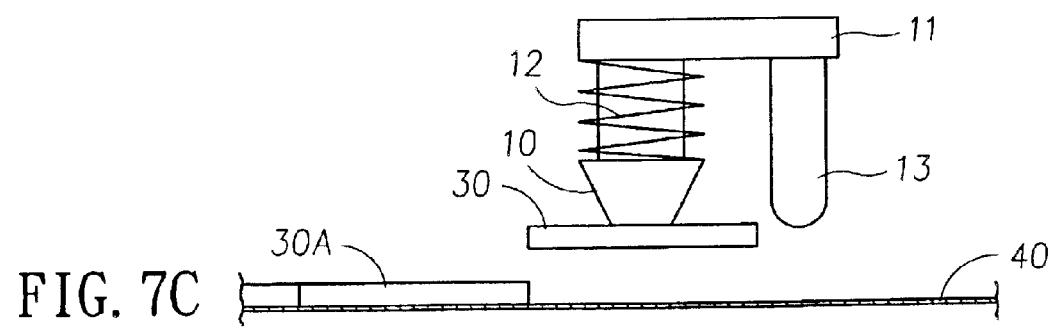

Another point is emphasized further: the embodied method, shown in FIG. 7, pressing down the glue membrane by the connection rod, may be adapted to chips with various sizes, particularly to the chip with dimension smaller than 0.5 mm×0.5 mm; for the vacuum adhesion manner shown in FIG. 4 and FIG. 5, when the size of the chip becomes smaller, the vacuum adhesion hole must also be shrunk accordingly, and the strength of the vacuum sucking ability is subsequently reduced so, basing upon the increasingly developing trend for reducing the size of the chip, the operation manner by a connection rod is a more appropriate choice.

Summarizing said two kinds of method according to the invention for separating object from glue membrane wherein the pick-up of chip is described as example, it is characterized: an external force such as tearing apart is pre-applied for appropriately separating the glue membrane and the object, such that the binding ability between the object and the glue membrane is reduced, and a taking-and-placing head then sucks up the object; since the external force is not applied upon the object, so it may control the deforming rate of the objet to a minimum degree, such that the object may be avoided from being broken and be not caused to move, and it may also peel apart multiple chips, such that the production speed is increased and the taking-up time is shortened; from the experiment of the inventor, it is known that, for chip with 5 mm×5 mm dimension, the tension needed for the said tearing apart method to make the glue membrane separated from the object is only 1 gram so, not only may the damage possibly occurred to the object by using the traditional picking-up manner be greatly improved, but also is it suitable for picking-up the thin object such as a thin chip, so it obviously should possess the industrial practicability and progressiveness; however, the description and the drawings disclosed thereinbefore are only the preferable embodiments according to the invention and are not applied to limit the practically embodying field of the invention, so any variation made according to said description and the structural characteristics and functions written in the following claims such as the change of value and the replacement of equivalent element is still belonged to the field of the invention.

What is claimed is:

1. A separation method for object and glue membrane is comprised of following steps:

a) arranging a machine used for supporting the chip, under which a glue membrane is adhered, and a moveable taking-and-placing head is arranged above the machine;

b) arranging a connection rod beside the taking-and-placing head, such that the connection rod is lifted up and lowered down simultaneously with the taking-and-placing head;

c) the taking-and-placing head is moved to the top of the chip and is positioned and, before the taking-and-placing head being lowered down to contact with and adhere to the surface of the chip, the connection rod is brought along firstly to be pressed down upon the surface of the glue membrane to generate a tearing apart force to separate the chip from the glue membrane; and d) after the taking-and-placing head being indeed adhered to the chip, the taking-and-placing head is lifted to suck the chip up and, in the meantime, the connection rod separates from the glue membrane.

2. The separation method for object and glue membrane according to claim 1, wherein the length of the connection rod is approximately longer than that of the taking-and-placing head such that, before the taking-and-placing head is lowered down and contacts with the object, the connection rod has already contacted the glue membrane to press down the glue membrane.

3. The separation method for object and glue membrane according to claim 1, wherein the pressing down force acting on the glue membrane by the connection rod may weaken the bonding force between the object and the glue membrane, but the object and the glue membrane have not separated from each other yet.

4. The separation method for object and glue membrane according to claim 1, wherein plural taking-and-placing heads and connection rods are arranged in parallel according to the space between each object and, when the plural taking-and-placing heads are lowered down, the connection rods may be brought along to press down the glue membrane to synchronously suck up plural objects.

* * * * *